(12) United States Patent
Chan et al.

(10) Patent No.: US 7,936,638 B2
(45) Date of Patent: May 3, 2011

(54) ENHANCED PROGRAMMABLE PULSEWIDTH MODULATING CIRCUIT FOR ARRAY CLOCK GENERATION

(75) Inventors: Yuen H. Chan, Poughkeepsie, NY (US); Michael J. H. Lee, Austin, TX (US); Rolf Sautter, Bondorf (DE); Tobias Werner, Weil im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 52 days.

(21) Appl. No.: 12/472,510

(22) Filed: May 27, 2009

(65) Prior Publication Data

US 2010/0302895 A1    Dec. 2, 2010

(51) Int. Cl.
*G11C 8/00* (2006.01)
(52) U.S. Cl. .................. 365/233.1; 365/154; 365/204
(58) Field of Classification Search ............... 365/233.1, 365/154, 203, 204
See application file for complete search history.

(56) References Cited

U.S. PATENT DOCUMENTS

| 6,115,836 | A | 9/2000 | Churchill et al. |
| 7,764,535 | B2 * | 7/2010 | Nguyen ........................ 365/154 |

* cited by examiner

*Primary Examiner* — Huan Hoang
(74) *Attorney, Agent, or Firm* — Matthew W. Baca; Jack V. Musgrove

(57) ABSTRACT

A pulsewidth modulation circuit uses a plurality of programmable paths to connect its output line to ground connections. The paths have different numbers of serially-connected NFETs to provide different pulldown rates. A desired programmable paths is selected based on encoded control signals, with decode logic integrated into the programmable paths. The decode logic includes, for each path, at least two transistors controlled by one of the encoded signals or their complements. A default path to ground may also be provided for use when none of the programmable paths is selected. For example, two encoded signals may be used to select 1-in-4 among the default path and three programmable paths. Integration of the decode logic into the programmable paths results in smaller overall circuit area, leading to reduced power usage, while still retaining the orthogonal benefit of encoded control signals.

19 Claims, 3 Drawing Sheets

ENHANCED PROGRAMMABLE PULSEWIDTH MODULATING CIRCUIT FOR ARRAY CLOCK GENERATION

BACKGROUND OF THE INVENTION

1. Field of the Invention

The present invention generally relates to pulsewidth modulation of an electronic signal, more specifically to a programmable circuit for pulsewidth modulation of a clock signal in an integrated circuit, and particularly for use in clocking an array such as static random-access memory (SRAM).

2. Description of the Related Art

Integrated circuits are used for a diverse number of electronic applications, from simple devices such as wristwatches to the most complex computer systems. Integrated circuits rely on a variety of clock signals to ensure proper circuit performance, but timing closure is becoming more difficult with the latest technologies like 65-nanometer integrated circuit design. There is an additional challenge for the circuit designer in constructing clock circuits that use reduced power. Low power circuits are becoming more prevalent due to power consumption problems. In particular, power dissipation has become a limiting factor for the yield of high-performance circuit designs (operating at frequencies around 1 gigahertz or more) fabricated in deep submicron technologies. Clock nets can contribute up to 50% of the total active power in multi-GHz designs. Low power designs are also preferable since they exhibit less power supply noise and provide better tolerance with regard to manufacturing variations.

A typical clock control system has a pulsed clock generation circuit (e.g., a phase-lock loop) that generates a master clock signal. The master clock signal is fed to a clock distribution network that renders synchronized global clock signals at clock distribution structures such as local clock buffers (LCBs). Each LCB adjusts the global clock duty cycle and edges to meet the requirements of respective circuit elements, for example, local logic circuits, latches or memory arrays. In the example of static, random-access memory (SRAM) control, the LCB first generates a local clock signal, and a delayed local clock signal is obtained by delaying and extending the pulse width of the local clock signal using inverter chains. The local clock signal and delayed local clock signal are buffered to generate wordline, precharge and latching signals for the array of memory storage elements. The most critical timing component in the SRAM control is the local clock signal pulse width which determines SRAM read and write time windows.

Since these pulsed clocks are not changing with frequency, several programmable settings can be provided for the pulsed-clock generation circuitry to allow for pulsewidth modulation so that the hardware can have a better chance at satisfactory operation if the default pulsed clock was inadequate due to design error, model-to-hardware differences, etc. Pulsewidth modulation (PWM) is also useful for margin testing in the hardware—shrinking or expanding the pulsewidth from the default width provides an indication of design robustness. However, the capability of programmable settings adds unwanted overhead to the circuit design, as illustrated in FIGS. 1A and 1B.

FIG. 1A shows a prior art programmable PWM circuit 10 that may be used for array clock generation. An input line (clock signal) is connected to an inverter 12 formed by a p-type field-effect transistor (PFET) 14 and an n-type field-effect transistor (NFET) 16. The drain of PFET 14 is connected to the circuit power supply ($V_{dd}$), the source of PFET 14 is connected to the drain of NFET 16, and the drain of NFET 16 is connected to electrical ground. The input line controls the gates of PFET 14 and NFET 16, so the signal value at the node between these two transistors is the complement of the input line. This node is further connected to another inverter 18 formed by a PFET 20 and an NFET 22. The drain of PFET 20 is again connected to the circuit power supply, the source of PFET 20 is connected to the drain of NFET 22, and the drain of NFET 22 is connected to a plurality of programmable paths that lead to electrical ground connections 24a, 24b, 24c. The node between PFET 20 and NFET 22 (i.e., the output of inverter 58) is connected to an output line of PWM circuit 10. The output line is also connected to a default path through NFET 22 leading to electrical ground connection 26.

The pulse width of the output signal is modulated by selecting one of the programmable paths, or just the default path, to control the pulldown rate, i.e., the speed at which the output line is brought to electrical ground. The pulldown rate is determined by the minimum number of NFETs along the available paths to ground. The programmable path to ground connection 24a passes through NFET 28a with no interconnecting transistor, so this path has a total of two NFETs (including NFET 22). The programmable path to ground connection 24b passes through an interconnecting NFET 32a and through NFET 28b, so this path has a total of three NFETs. The programmable path to ground connection 24c passes through another interconnecting NFET 32b and through NFET 28c, so this path has a total of four NFETs. The default path to ground connection 26 through NFET 30 also has four NFETs.

Programmable bits PW0, PW1, PW2 control the gates of NFETs 24a, 24b, 24c, respectively, so the setting of the programmable bits determines the minimum number of NFETs in the pulldown stack to ground. If the setting is PW0=0, PW1=0 and PW2=0, then NFETs 24a, 24b, 24c will all be non-conducting and the only available path to ground is through the default path, having four NFETs. NFET 30 is relatively weak so the default path is effective only when all of the programmable paths are non-active. If PW0=0, PW1=0 and PW2=1, then only NFET 28c closes, providing an additional path to ground; there would still be a minimum of four NFETs in either of the two stacks but there is effectively a bigger NFET at the bottom of the stack since NFETs 28c and 30 are active and connected in parallel to ground. If PW0=0, PW1=1 and PW2=0, then only NFET 24b closes and there would be three NFETs in the minimum stack to ground. If PW0=1, PW1=0 and PW2=0, then only NFET 24a closes and there would be two NFETs in the minimum stack to ground. When there are more NFETs stacked in series along the ground path, the result is a slower pulldown rate; more NFETs connected in parallel results in a faster pulldown.

Programmable bits PW0 and PW1 are also used to control PFETs 34a and 34b which couple the power supply voltage to the interconnecting NFETs 32a, 32b through respective PFETs 36a, 36b. NFETs 32a, 32b and PFETs 36a, 36b are controlled by the output of inverter 12, to shut off the power supply voltage when PWM circuit 10 is pulling down the output line.

These four possible combinations of PW0, PW1, PW2 are encoded into two control bits a and b which are decoded using the decoder circuit 40 illustrated in the gate-level schematic of FIG. 1B. Decoder circuit 40 generates complements of the a and b signals using two inverters 42a, 42b. A first NOR gate 44a generates the PW0 bit from signal b and the complement of signal a. A second NOR gate 44b generates the PW1 bit from signals a and b. A third NOR gate 44c generates the PW2 bit from signal a and the complement of signal b. This construction results in the orthogonal generation of programmable bits PW0, PW1, PW2, i.e., it generates the programmable bits in such a manner as to result in four exclusive modulation values. The control bits a and b may for example be stored in general purpose timing registers (GPTRs).

The inclusion of an explicit (separable) decoder as part of the PWM circuit adds more devices to the circuit design and, hence, leads to more chip area and power consumption. The only alternative to the addition of a decoder structure is to provide the three programmable bits PW0-PW2 directly from the general purpose timing registers, but this alternative still requires the addition of one more GPTR bit. Also, the non-encoded signals utilized in such a case would lose the orthogonal attribute of a decoded structure. It would, therefore, be desirable to devise an improved PWM circuit which could provide efficient pulsewidth modulation with reduced or minimum control overhead to save chip area and power. It would be further advantageous if the circuit could still retain the orthogonal benefit of encoded control signals.

SUMMARY OF THE INVENTION

It is therefore one object of the present invention to provide an improved pulsewidth modulation (PWM) circuit.

It is another object of the present invention to provide such a PWM circuit that reduces or minimizes control overhead.

It is yet another object of the present invention to provide such a PWM circuit that uses encoded signals to control the pulsewidth modulation.

The foregoing objects are achieved in a PWM circuit generally comprising an input line, an output line responsive to the input line, a plurality of programmable paths connecting the output line to ground connections with different pulldown rates, and means for selecting a desired one of the programmable paths based on a plurality of encoded control signals. The selecting means includes decode logic integrated with the programmable paths. The decode logic includes at least two serially-connected transistors along a given programmable path, wherein the transistors are controlled by one of the encoded signals or their complements. In the preferred embodiment the transistors are n-type field effect transistors. The PWM circuit of the present invention is particularly suited for use in modulating the pulse width of a precharge clock signal for a memory array such as static, random-access memory (SRAM).

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 2:
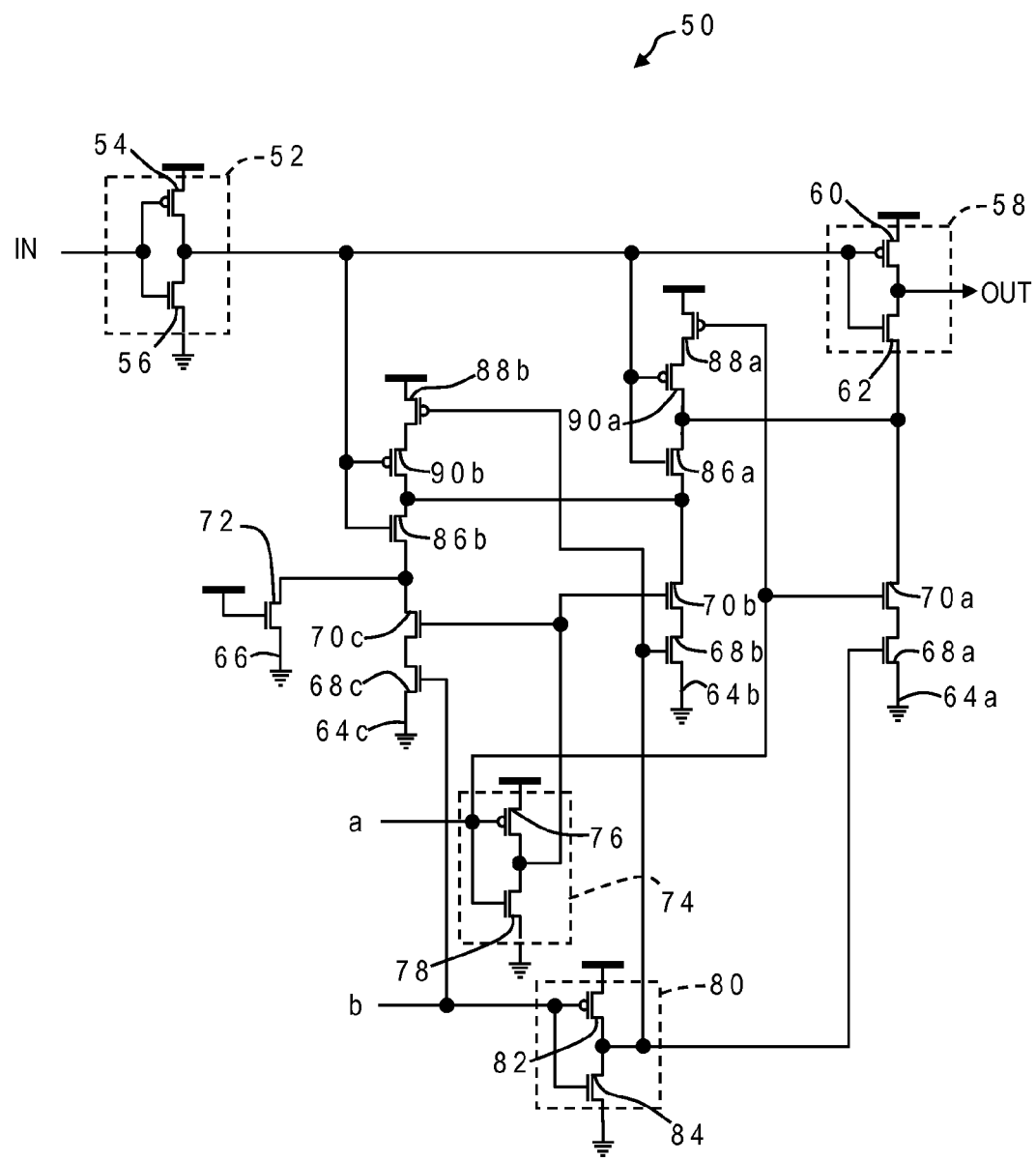
FIG. 2 is a transistor-level schematic diagram of one embodiment of a PWM circuit constructed in accordance with the present invention having integrated decode logic.

With reference now to the figures, and in particular with reference to FIG. 2, there is depicted one embodiment 50 of an enhanced, programmable pulsewidth modulation (PWM) circuit constructed in accordance with the present invention. PWM circuit 50 has an input line which receives a clock signal (i.e., a signal switching binary states) and is connected to an inverter 52 formed by a p-type field-effect transistor (PFET) 54 and an n-type field-effect transistor (NFET) 56. The drain of PFET 54 is connected to the circuit power supply ($V_{dd}$), the source of PFET 54 is connected to the drain of NFET 56, and the drain of NFET 56 is connected to electrical ground. The input line controls the gates of PFET 54 and NFET 56, so the signal value at the node between these two transistors is the complement of the input line. This node is further connected to another inverter 58 formed by a PFET 60 and an NFET 62. The drain of PFET 60 is again connected to the circuit power supply, the source of PFET 60 is connected to the drain of NFET 62, and the drain of NFET 62 (the pulldown node) is connected to a plurality of programmable paths that lead to electrical ground connections 64a, 64b, 64c. The node between PFET 60 and NFET 62 (i.e., the output of inverter 58) is connected to an output line of PWM circuit 50. The output line is thus coupled to the input line by the two inverters 52, 58 and its signal value is responsive to the signal value of the input line, i.e., the output line will be connected to one ground connections whenever the input line is in a low logic state. The output line is also connected to a default path leading to another electrical ground connection 66.

The programmable path from the output line to ground connection 64a passes through NFETs 68a and 70a, so this path has a total of three NFETs (including NFET 62). The programmable path to ground connection 64b passes through an interconnecting NFET 86a and through NFETs 68b and 70b, so this path has a total of four NFETs. The programmable path to ground connection 64c passes through another interconnecting NFET 86b and through NFETs 68c and 70c, so this path has a total of five NFETs. The default path to ground connection 66 through NFET 72 has four NFETs. Each of NFETS 68a, 68b, 68c, 70a, 70b, 70c is controlled by one of two encoded control signals a and b, or their complements. The complement of control signal a is generated by an inverter 74 having a PFET 76 connected to the power supply voltage and an NFET 78 connected to ground. The complement of control signal b is generated by an inverter 80 having a PFET 82 connected to the power supply voltage and an NFET 84 connected to ground.

These gate control connections are designed to allow the four possible combinations of control bits a and b to orthogonally select a desired one of four different paths from the output line to ground, in order to vary the minimum number of NFETs in the stack to ground and thereby modulate the clock signal pulsewidth. If control bit a=1 and control bit b=1, then NFETs 68a, 68b, and 70c will be non-conducting thereby blocking the paths to ground connections 64a, 64b, 64c, and the only available path to ground remaining is through the default path to ground connection 66. NFET 72 is relatively weak so the default path is effective only when all of the programmable paths are non-active. If control bit a=0 and control bit b=1, then NFETs 68*b* and 70*a* are non-conducting thereby blocking the paths to ground connections 64*a*, 64*b*, but both NFETs 68*c*, 70*c* close to provide a path to ground connection 64*c*, so there would be a minimum of five NFETs in the active stack. If control bit a=0 and control bit b=0, then NFETs 68*c* and 70*a* are non-conducting thereby blocking the paths to ground connections 64*a*, 64*c*, but both NFETs 68*b*, 70*b* close to provide a path to ground connection 64*b*, so there would be four NFETs in the minimum stack to ground. If control bit a=1 and control bit b=0, then NFETs 68*c* and 70*b* are non-conducting thereby blocking the paths to ground connections 64*b*, 64*c*, but both NFETs 68*a*, 70*a* close to provide a path to ground connection 64*a*, so there would be three NFETs in the minimum stack to ground.

Control bit a and the complement of control bit b also gate respective PFETs 88*a* and 88*b*. PFETs 88*a* and 88*b* couple the power supply voltage to the interconnecting NFETs 86*a*, 86*b* through respective PFETs 90*a*, 90*b*, to charge the drain nodes of interconnecting NFETs 86*a*, 86*b* back up to $V_{dd}$ when the clock signal transitions to the other phase (high logic state). NFETs 86*a*, 86*b* and PFETs 90*a*, 90*b* are controlled by the output of inverter 52, to shut off the power supply voltage when PWM circuit 50 is pulling down the output line. The present invention may be practiced without these PFETs but their use is preferable to impart more precise delay behavior.

The control bits may be kept in any convenient storage elements such as general purpose timing registers (GPTRs) or other system control registers. The registers are preferably accessible using a boundary-scan architecture having a scan chain and scan controller. The control bits may be set at the factory after testing to determine an optimum PWM setting. Alternatively the control bits could be set dynamically based on instantaneous feedback or be set after a re-start using a calibration procedure.

Figure 1A:
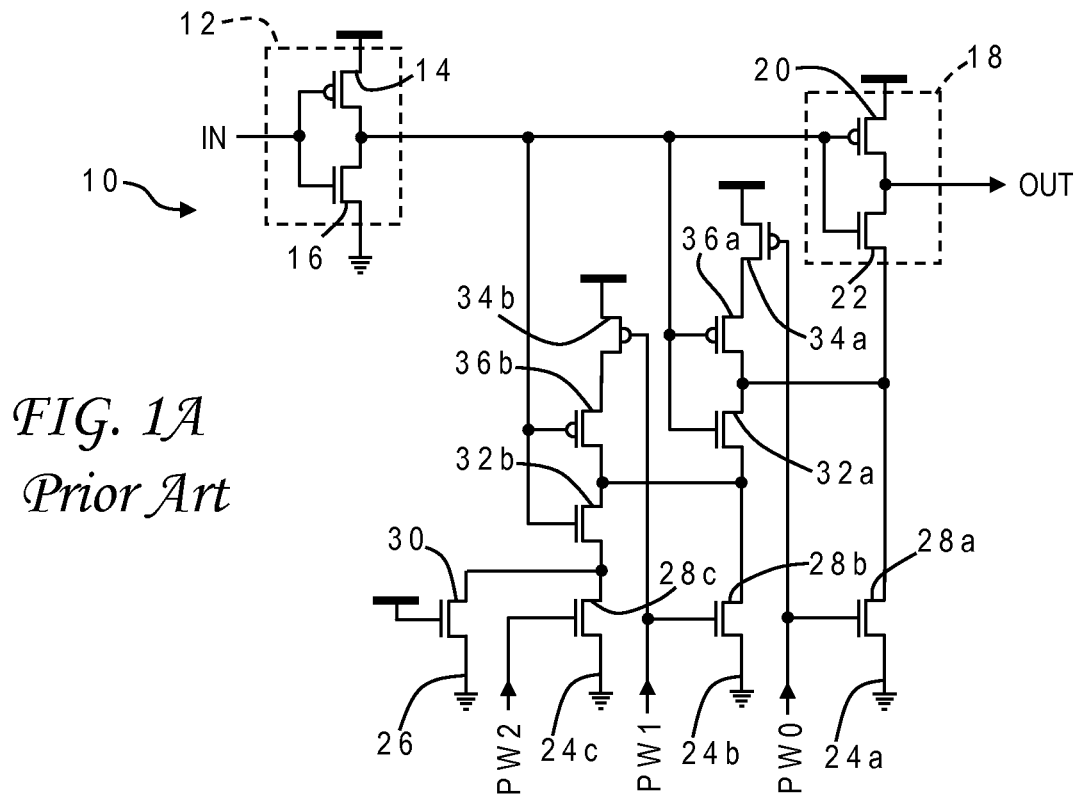
FIG. 1A is a transistor-level schematic diagram of a conventional pulsewidth modulation (PWM) circuit having programmable paths responsive to decoded control signals.
Figure 1B:
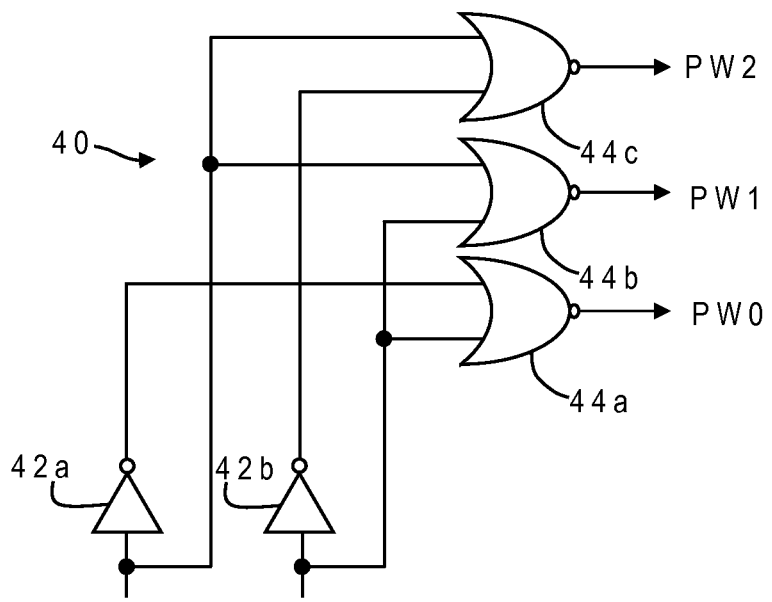
FIG. 1B is a gate-level schematic diagram of a conventional decoder circuit used to decode the control signals which select the programmable paths in the PWM circuit of FIG. 1A.

The resulting PWM circuit 50 is much more area-efficient since it integrates the decoding logic into the programming circuitry. PWM circuit 50 accomplishes programmable pulsewidth modulation with only two control inputs compared to the prior art circuit of FIG. 1A which requires three control inputs. PWM circuit 50 does not require any separable decoder circuit although it does add a small amount of overhead. Each of the three programmable paths has one extra transistor at the ground connection as compared to the prior art, and four additional transistors are necessary to implement the inverters that generate complements of the control signals, so PWM circuit 50 has seven more transistors that the prior art circuit 10 of FIG. 1A. However, the decoder circuit 40 of FIG. 1B requires 16 transistors, so the present invention results in a net savings of nine transistors. Consequently, the overall circuit area and power usage are significantly reduced compared with the prior art designs. This area efficiency is amplified in chips wherein similar PWM circuits are replicated many times for different components.

Those skilled in the art will appreciate that the invention could be utilized with only programmable paths and no default path, i.e., the default path is optional. The invention could also encompass more than three programmable paths to ground, with more corresponding encoded control bits. For example, there could be eight paths selected by three encoded control bits.

In an alternative embodiment PFETs are used to control the connections to ground instead of NFETs, with appropriate changes to other gates. However, NFETs are deemed preferable since the pulsewidth requirement for pulsed-clock array designs tracks better with NFET performance due to the memory cell being strongly dependent on NFET passgate strength, and the fact that the signal propagation in arrays is accomplished using dynamic circuits for performance which also have a strong dependence on NFET strength. The modulation deltas between the various programmable settings can be adjusted by appropriate sizing of the devices. The specific sizes of the NFETs may vary considerably depending upon the application and device technology.

Figure 3:
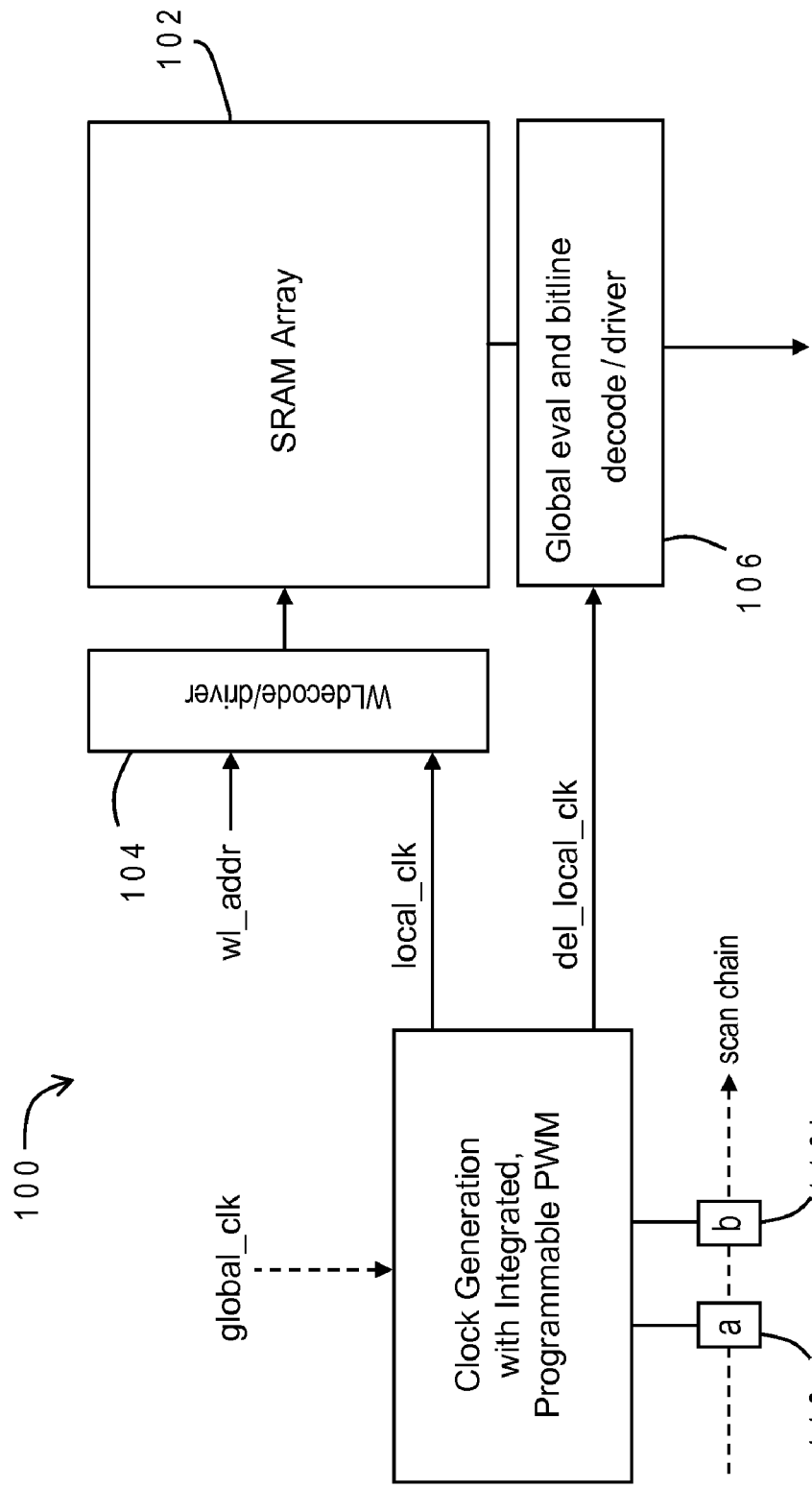
FIG. 3 is a block diagram illustrating one application of the present invention to clock generation for a static, random-access memory (SRAM) array.

PWM circuit 50 may be used in a variety of integrated circuit designs for purposes such as power control or transmission of information, but it is particularly useful as a component of clock generation circuitry. One specific application for PWM circuit 50 is to adjust the width of a precharge clock pulse for a static, random-access memory (SRAM) circuit as illustrated in FIG. 3. Memory circuit 100 includes an SRAM array 102, a word line decode/driver 104, a global evaluate and bitline decode/driver 106, and a clock generation circuit 108. SRAM array 102 has memory cells arranged in rows and columns. Clock generation circuit 108 provides a local clock signal (local_clk) to word line decode/driver 104, and provides a delayed local clock signal (del_local_clk) to global evaluate and bitline decode/driver 106. A word line address for a requested block of memory is input to a word line decode/driver 104 which energizes the corresponding row of memory cells in SRAM array 102 when the local clock signal is in the active phase. Global evaluate and bitline decode/driver 106 senses the values in the targeted memory cells and outputs the memory block to the requesting entity (such as a microprocessor) when the delayed local clock signal is active.

Clock generation circuit 108 may have its own internal clock source (an oscillator and phase-lock loop), or it may receive a global clock signal (global_clk) from a master clock source as an input. Clock generation circuit 108 further includes an integrated programmable PWM circuit of the present invention, e.g., PWM circuit 50, to adjust the width of the local clock signal. This programmable PWM circuit receives the control bits a and b from GPTRs 110*a*, 110*b*, which form part of the scan chain for memory circuit 100. The delayed local clock signal may be generated with a pre-calculated delay time from an inverter chain. A second PWM circuit constructed in accordance with the present invention may optionally be used to adjust the pulse width of the delayed local clock signal. The PWM circuit of the present invention is equally useful with other circuit array such as register files.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. An electrical circuit comprising:
an input line adapted to receive a input signal switching binary states;
an output line providing an output signal switching binary states responsive to said input line;
a plurality of programmable paths connecting said output line to ground connections wherein said programmable paths provide different pulldown rates; and
means for selecting a desired one of the programmable paths based on a plurality of encoded control signals without using a separable decoder circuit, said selecting means including decode logic integrated with said programmable paths.

2. The circuit of claim 1 wherein there are two encoded control signals and three programmable paths.

3. The circuit of claim 1, further comprising a default path to another ground connection for use when none of said programmable paths are selected.

4. The circuit of claim 1 wherein said selecting means further includes a plurality of inverters which respectively generate complements of the encoded control signals.

5. The circuit of claim 1 wherein:
said decode logic includes at least first and second serially-connected transistors, said first transistor being controlled by a first one of said encoded signals and said second transistor being controlled by a complement of a second one of said encoded signals; and
one of said programmable paths passes through said first and second transistors.

6. The circuit of claim 1 wherein said programmable paths have different numbers of transistors connected in series to provide the different pulldown rates.

7. The circuit of claim 6 wherein the transistors are n-type transistors.

8. A circuit for modulating the pulsewidth of a pulsed clock signal, comprising:
a clock input line which receives the pulsed clock signal;
a clock output line coupled to said clock input line;
a plurality of pulldown paths connected to said clock output line, said pulldown paths having different numbers of interconnecting transistors;
a plurality of ground connections;
a first plurality of transistors having first nodes connected respectively to said ground connections, and having second nodes;
a second plurality of transistors having first nodes connected respectively to said second nodes of said first plurality of transistors, and having second nodes connected respectively to said pulldown paths; and
a plurality of control inputs, wherein each of said first plurality of transistors and each of said second plurality of transistors is controlled by one of said control inputs or a complement of one of said control inputs to selectively connect said clock output line to one of said ground connections using a desired one of said pulldown paths in response to a low logic state at said clock input line, and wherein
a first one of said first plurality of transistors connected to a first one of said ground connections is controlled by a first one of said control inputs;
a first one of said second plurality of transistors connected to said first one of said first plurality of transistors is controlled by a complement of a second one of said control inputs;
a second one of said first plurality of transistors connected to a second one of said ground connections is controlled by said second control input; and
a second one of said second plurality of transistors connected to said second one of said first plurality of transistors is controlled by a complement of said first control input.

9. The circuit of claim 8 wherein:
said clock output line is coupled to said clock input line by a first inverter having an input connected to said clock input line and a second inverter having an input connected to an output of said first inverter, said clock output line being connected to an output of said second inverter; and
each of said pulldown paths is connected to an n-type transistor of said second inverter.

10. The circuit of claim 8 wherein there are two encoded control signals and three pulldown paths.

11. The circuit of claim 8, further comprising a default path from said clock output line to another ground connection for use when none of said pulldown paths are selected.

12. The circuit of claim 8 wherein said first plurality of transistors and said second plurality of transistors are n-type transistors.

13. A programmable pulsewidth modulation circuit comprising:
an input line;
a first inverter whose input is connected to said input line;
a second inverter whose input is connected to an output of said first inverter;
an output line connected to an output of said second inverter;
a first control input;
a second control input;
a third inverter whose input is connected to said first control input;
a fourth inverter whose input is connected to said second control input;
a first n-type transistor having a gate connected to said first control input, a first node connected to a pulldown node of said second inverter, and a second node;
a second n-type transistor having a gate connected to an output of said fourth inverter, a first node connected to said second node of said first n-type transistor, and a second node connected to a first ground connection;
a third n-type transistor having a gate connected to said output of said first inverter, a first node connected to said pulldown node of said second inverter, and a second node;
a fourth n-type transistor having a gate connected to an output of said third inverter, a first node connected to said second node of said third n-type transistor, and a second node;
a fifth n-type transistor having a gate connected to said output of said fourth inverter, a first node connected to said second node of said fourth n-type transistor, and a second node connected to a second ground connection;
a sixth n-type transistor having a gate connected to said output of said first inverter, a first node connected to said second node of said third n-type transistor, and a second node;
a seventh n-type transistor having a gate connected to said output of said third inverter, a first node connected to said second node of said sixth n-type transistor, and a second node; and
a eighth n-type transistor having a gate connected to said second control input, a first node connected to said second node of said seventh n-type transistor, and a second node connected to a third ground connection.

14. The programmable pulse width modulation circuit of claim 13, further comprising first and second control registers which store programmable bits, an output of said first control register being connected to said first control input and an output of said second control register being connected to said second control input.

15. The programmable pulse width modulation circuit of claim 13, further comprising:
a first p-type transistor having a gate connected to said first control input, a first node connected to a circuit power supply, and a second node;
a second p-type transistor having a gate connected to said output of said first inverter, a first node connected to said second node of said first p-type transistor, and a second node connected to said pulldown node of said second inverter;

a third p-type transistor having a gate connected to said output of said third inverter, a first node connected to said circuit power supply, and a second node; and a fourth p-type transistor having a gate connected to said output of said first inverter, a first node connected to said second node of said third p-type transistor, and a second node connected to said second node of said third n-type transistor.

16. The programmable pulse width modulation circuit of claim 13, further comprising a ninth n-type transistor having a gate connected to said a circuit power supply, a first node connected to said second node of said sixth n-type transistor, and a second node connected to a fourth ground connection.

17. The programmable pulse width modulation circuit of claim 16, wherein said ninth n-type transistor has a size which is small relative to said first, second, third, fourth, fifth, sixth, seventh and eighth n-type transistors.

18. A memory circuit comprising:
a memory array;
a driver circuit for energizing storage cells of said memory array corresponding to a word line address during an active phase of a precharge clock signal; and
a clock generation circuit including a clock source and a pulsewidth modulation circuit which receives the clock source as an input and generates the precharge clock signal, said pulsewidth modulation circuit having an input line, an output line responsive to said input line, a plurality of control inputs, and a plurality of programmable paths from said output line to ground connections providing different pulldown rates, wherein at least one of said programmable paths includes first and second serially-connected transistors, said first transistor being controlled by a first one of said control inputs and said second transistor being controlled by a complement of a second one of said control inputs.

19. The memory circuit of claim 18, further comprising first and second scannable registers which store programmable bits, an output of said first control register being connected to said first control input and an output of said second control register being connected to said second control input.

* * * * *